United States Patent
Gallo

(10) Patent No.: US 9,070,877 B2
(45) Date of Patent: Jun. 30, 2015

(54) MEMORY ELEMENTS AND METHODS WITH IMPROVED DATA RETENTION AND/OR ENDURANCE

(71) Applicant: Adesto Technologies Corporation, Sunnyvale, CA (US)

(72) Inventor: Antonio R. Gallo, San Mateo, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 61 days.

(21) Appl. No.: 13/972,718

(22) Filed: Aug. 21, 2013

(65) Prior Publication Data

US 2013/0344649 A1  Dec. 26, 2013

Related U.S. Application Data

(62) Division of application No. 13/464,895, filed on May 4, 2012, now Pat. No. 8,531,867.

(60) Provisional application No. 61/483,006, filed on May 5, 2011.

(51) Int. Cl.
| | |
|---|---|
| *H01L 21/00* | (2006.01) |
| *H01L 45/00* | (2006.01) |
| *G11C 13/00* | (2006.01) |

(52) U.S. Cl.
CPC .............. *H01L 45/16* (2013.01); *G11C 13/0007* (2013.01); *G11C 13/0011* (2013.01); *H01L 45/085* (2013.01); *H01L 45/142* (2013.01); *H01L 45/1641* (2013.01)

(58) Field of Classification Search
CPC ................... H01L 27/2436; H01L 2924/0002; H01L 45/16; H01L 27/101; H01L 27/2409; H01L 27/2454; H01L 27/2463; H01L 2924/00; H01L 29/1054; H01L 29/66477; H01L 29/66666; H01L 29/66795; H01L 29/7827
USPC .......... 365/148, 163; 438/118, 122, 287, 382, 438/592, 602; 257/2, 4, 288, 779, E45.003
See application file for complete search history.

(56) References Cited

PUBLICATIONS

U.S. Appl. No. 13/464,895, filed May 4, 2012, parent to the present divisional patent application.

*Primary Examiner* — Mark A Laurenzi

(57) ABSTRACT

A method can include forming at least one memory layer over a first electrode, the memory layer having at least one element formed therein that oxidizes in the presence of an electric field to form conductive paths within the memory layer; and forming an inhibiting layer within the memory layer that increases an oxidation energy for the at least one element, as compared to the oxidation energy for the at least one element in the memory layer without the inhibiting layer.

20 Claims, 12 Drawing Sheets

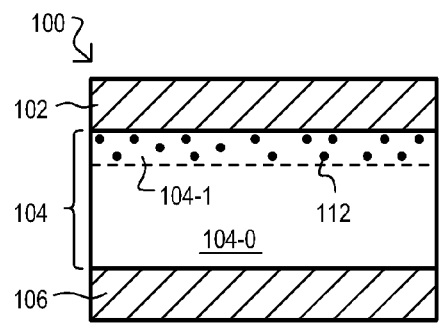 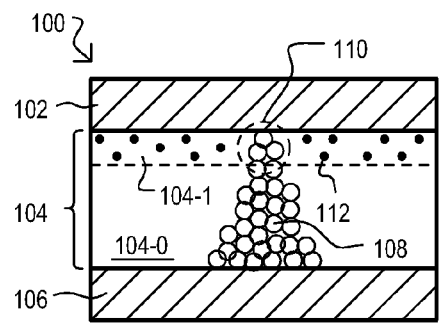
FIG. 1A　　　　　　　　FIG. 1B
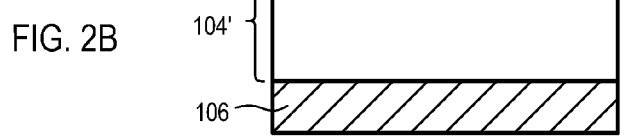
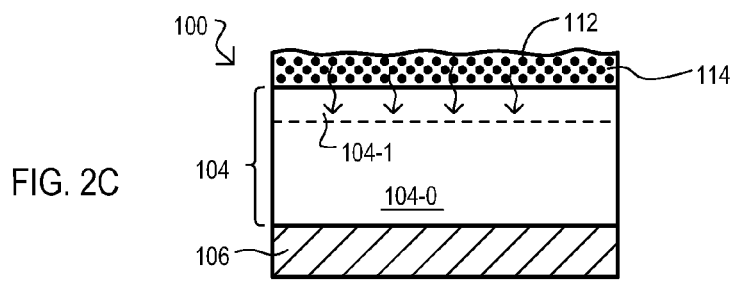
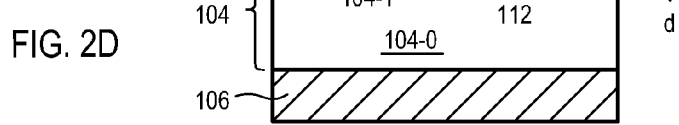

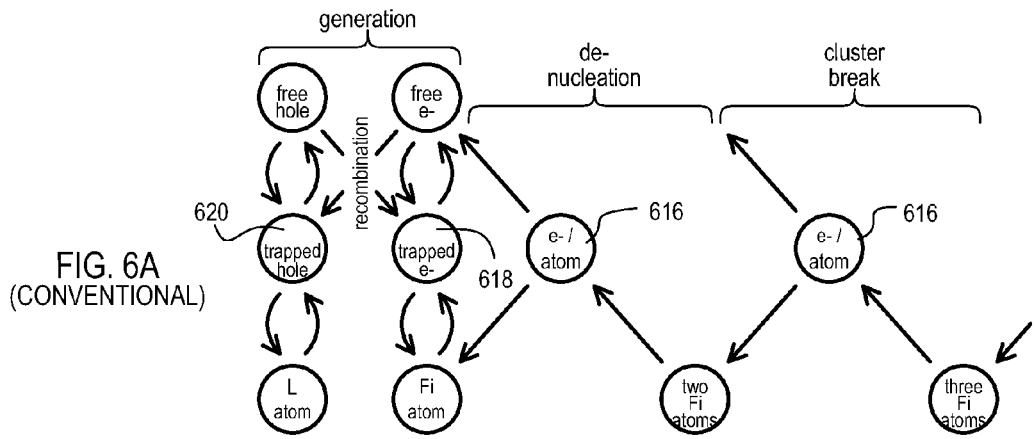
FIG. 6A
(CONVENTIONAL)

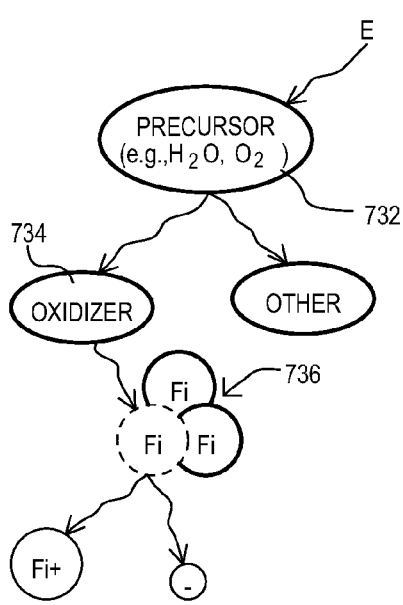
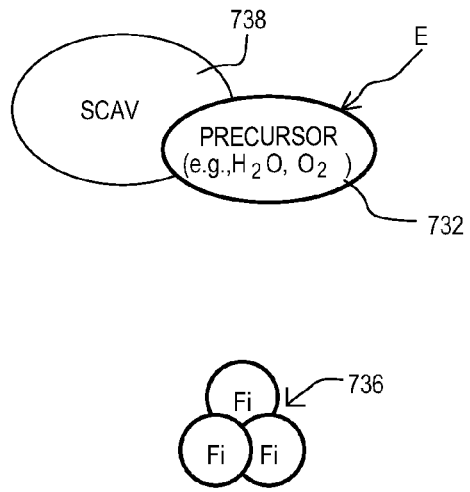
FIG. 7A
(CONVENTIONAL)
FIG. 7B
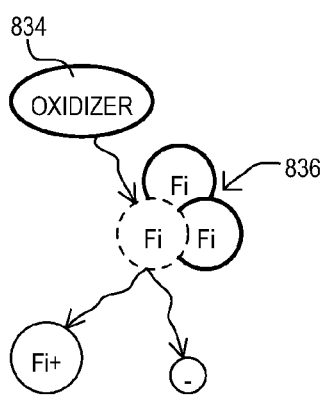
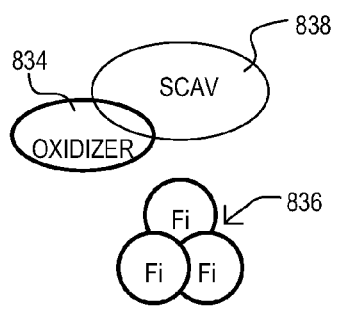
FIG. 8A
(CONVENTIONAL)
FIG. 8B

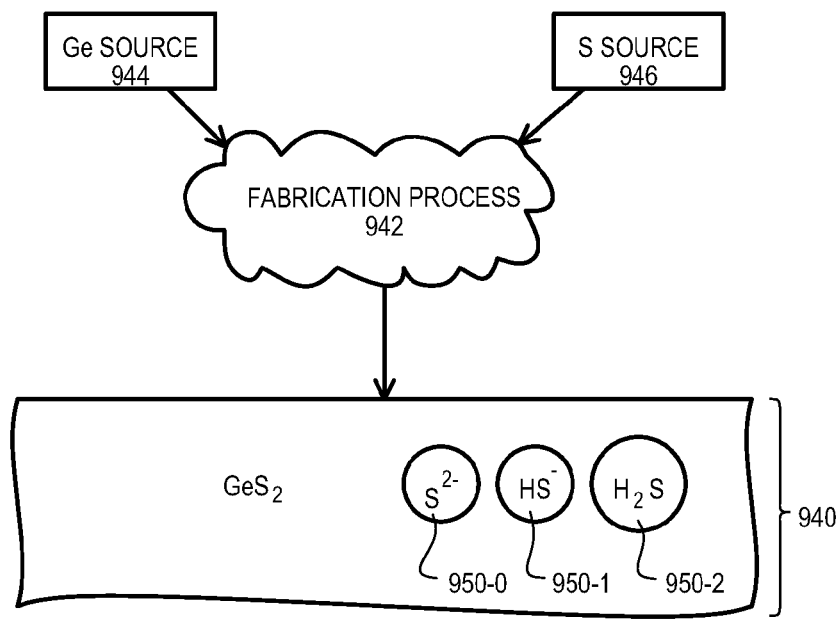
FIG. 9A
(CONVENTIONAL)

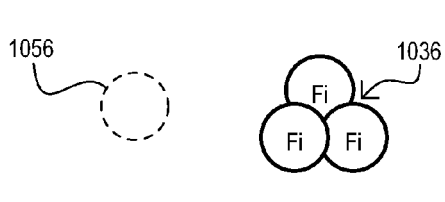
FIG. 10A
(CONVENTIONAL)
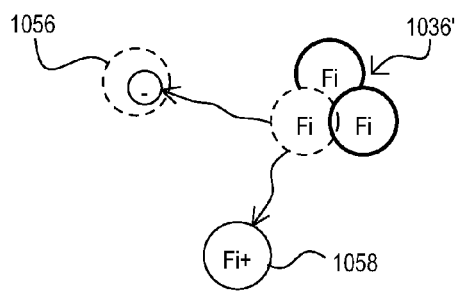
FIG. 10B
(CONVENTIONAL)
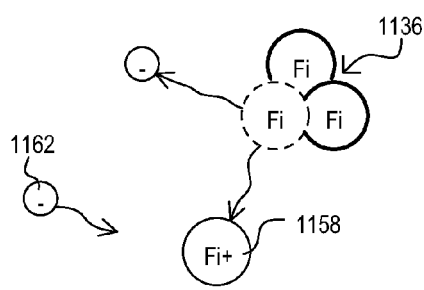
FIG. 11A
(CONVENTIONAL)
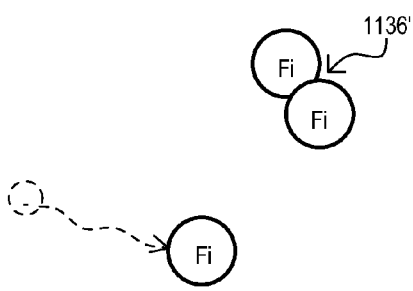
FIG. 11B
(CONVENTIONAL)

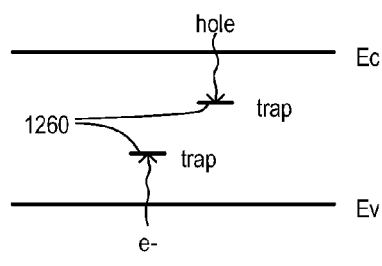
FIG. 12A
(CONVENTIONAL)
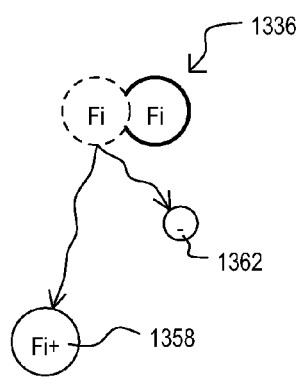
FIG. 13A
(CONVENTIONAL)

(BACKGROUND)

(BACKGROUND)

(BACKGROUND)

(BACKGROUND)

(BACKGROUND)

(BACKGROUND)

(BACKGROUND)

MEMORY ELEMENTS AND METHODS WITH IMPROVED DATA RETENTION AND/OR ENDURANCE

This application is a divisional patent application of U.S. patent application Ser. No. 13/464,895, filed May 4, 2013, which claims the benefit of U.S. Provisional Patent Application Ser. No. 61/483,006 filed on May 5, 2011, the contents both of which are incorporated by reference herein.

TECHNICAL FIELD

The present disclosure relates generally to memory elements for storing data values, and more particularly to memory elements that can form and dissolve conductive filaments for use in integrated circuits, or the like.

BACKGROUND

Memory devices, such as conductive bridging random access memories (CBRAMs), can have memory elements that can be programmed between high and low resistance values to store data. By application of an electric field, CBRAM type memory elements can form conductive regions (i.e., filaments) through a solid electrolyte layer to place the memory element in a low resistance state. A conductive filament can include clusters of metallic elements. Application of an opposing electric field can dissolve such filaments to place the memory element into a high resistance state.

Performance features of CBRAMs, and similar devices, can include data retention and endurance. Data retention is be the amount of time a memory element can retain a data value after being programmed (i.e., placed into a particular conductive state). Endurance is the number of times a memory element can be programmed to one or more states before its data retention is adversely affected. It is understood that the term "programmed" denotes those operations that place a memory element into a high resistance state as well as a low resistance state.

FIGS. 14A to 14D are diagrams representing potential degradation mechanisms of metal atom clusters that can make up conductive filaments in a solid electrolyte based memory element. FIGS. 14A to 14D show clusters of metallic elements (in this example silver) in a solid electrolyte (e.g., an ion conducting material).

FIGS. 14A and 14B show a metallic cluster 1401 of three silver atoms that can be formed within a solid electrolyte by application of an electric field. Clusters 1401 (and others like it) can establish a data state by creating conductive paths within the solid electrolyte. FIGS. 14A and 14B also show how such clusters 1401 can oxidize into smaller clusters 1405.

Referring to FIG. 14A, section 1470-0 shows an example of a metal atom 1403 that is oxidized, and then migrates from away from the cluster 1401 in a solid electrolyte layer. Section 1470-1 shows how a remaining electron can also migrate leaving the smaller cluster 1402, as shown in section 1470-2.

Referring to FIG. 14B, section 1470-3 show an example of a metal atom 1403 that is oxidized and initially remains with the cluster 1401 in an ionic form. Section 1470-4 shows how a metal ion can then subsequently migrate away from the cluster to form a smaller cluster 1405, as shown in section 1470-5.

FIGS. 14C and 14D show how a metallic cluster 1405 of two silver atoms can be oxidized to a point where the cluster is essentially dissolved (e.g., removed from a filament region). FIGS. 14C and 14D show a "trap" 1407 that can exist in a solid electrolyte material. A trap 1407 can present a structure within the solid electrolyte material conducive to the formation of a cluster.

FIG. 14C shows an example of the oxidation of a first atom, with migration of the ion out of the cluster (section 1473-0), followed by movement of the free electron out of the trap 1407 (section 1473-1). A remaining atom can oxidize (section 1473-2) and migrate, followed by the electron (section 1473-3). Consequently, the cluster can disappear, as shown in section 1473-4.

FIG. 14D shows another example of the oxidation of a first atom, with migration of the electron (section 1473-5) followed by the ion (section 1473-6). A remaining atom can oxidize (section 1473-7) and migrate (1473-8), resulting in dissolution of the cluster, as shown in section 1473-4.

It is understood that the oxidation described above can be intentionally induced by application of an electric field opposite to that which established the cluster. However, it is also believed that such clusters can degrade when not intended, which can adversely affect data retention and/or endurance of a memory element.

FIGS. 15A to 15C show data writing operations for a conventional CBRAM type memory element. A memory element 1509 has a solid electrolyte layer 1511 formed between an active electrode 1513, and an indifferent electrode 1515. It is understood that solid electrolyte layer 1511 includes an oxidizable metal incorporated within. Further, an active electrode 1513 can be a further source of the oxidizable metal.

FIG. 15A shows how the application of an electric field (+Vprog to −Vprog), that is positive in a direction from the active electrode to the indifferent electrode, can result in the oxidation of the metal (M) within solid electrolyte layer 1511.

FIG. 15B shows how application of an electric field can create a higher conductive structure 1517 or "filament" between the electrodes (1513/1515). Creation of such a filament can alter a conductivity through solid electrolyte layer 1511. A read voltage (+Vread to −Vread) can be applied to sense a conductivity across the electrodes.

Referring still to FIG. 15B, a portion 1519 of the conductive structure 1517 closer to the active electrode 1513 can have smaller metal atom clusters than portions closer to the indifferent electrode 1515. Consequently, portion 1519 can be more susceptible to degrading (e.g., oxidizing and then dissolving away), which can undesirably increase a resistance through solid electrolyte layer 1511.

FIG. 15C shows how the application of an electric field opposite to that of FIG. 15A (−Verase to +Verase) can result in the oxidation of the metal (M) within solid electrolyte layer 1511 that can reduce and/or substantially eliminate the conductive structure 1517.

BRIEF DESCRIPTION OF THE DRAWINGS

FIGS. 1A and 1B are side cross sectional views of a memory element according to an embodiment.

FIGS. 2A to 2D are a sequence of side cross sectional views showing a method of forming a memory element like that of FIGS. 1A and 1B.

FIGS. 6A to 6C are a sequence of diagrams that illustrate memory cell operations according to embodiments.

FIGS. 7A and 7B are diagrams showing oxidizer precursor inhibitor operations that can be included in embodiments.

FIGS. 8A and 8B are diagrams showing oxidizer inhibitor operations that can be included in embodiments.

FIGS. 9A and 9B are diagrams showing inhibitors for a memory element and fabrication system that includes germanium and sulfur.

FIGS. 10A to 10D are diagrams showing hole scavenger operations that can be included in embodiments.

FIGS. 11A to 11D are diagrams showing electron scavenger operations that can be included in embodiments.

FIGS. 12A and 12B are energy band diagrams showing deep hole and electron traps incorporated into a solid electrolyte layer according to embodiments.

FIGS. 13A to 13C are diagrams showing reducing agent operations that can be included in embodiments.

DETAILED DESCRIPTION OF THE EMBODIMENTS

Figure 3A:
FIGS. 3A to 3D are a sequence of side cross sectional views showing another method of forming a memory element like that of FIGS. 1A and 1B.

Below embodiments show memory element structures and methods of fabrication that can result in memory elements having an inhibitor material that can prevent and/or reduce mechanisms that can result in undesired dissolution of conductive filaments within a memory layer.

FIGS. 1A and 1B show a memory element 100 in side cross sectional views according to an embodiment. A memory element 100 can include a first electrode 102, a modified memory layer 104, and a second electrode 106. A first electrode 102 can be formed from one or more conductive materials, and in one embodiment, can be an "active electrode" that is a source of one or more metals that can oxidize and ion conduct through a memory layer 104. It is noted that in alternate embodiments, a first electrode need not include element(s) that contribute to a conductive filament within modified memory layer 104.

A modified memory layer 104 can be a layer in which conductive structures (e.g., filaments) can be created and dissolved by application of electric fields. In very particular embodiments, a memory layer 104 can be a solid electrolyte that enables one or more metals to ion conduct between electrodes 102 and 104. In some embodiments, a modified memory layer 104 can include one or more chalcogenide compounds with one or more ion conducting metals incorporated therein. In a very particular embodiment, a memory layer can include $GeS_2$ with silver incorporated therein. In alternate embodiments, a modified memory layer 104 can be metal oxide. Still further, a modified memory layer 104 can be one layer of a multi-layer memory structure formed between two electrodes.

A modified memory layer 104 can include a first portion 104-0 and a second portion 104-1. Unlike a first portion 104-0, a second portion 104-1 can include one or more inhibitor compounds or materials (represented by dots, one shown as 112). Inhibitor compounds or materials will be referred to herein with the term "inhibitor". An inhibitor can decrease an oxidation rate, and/or increase the energy required for oxidation, of an oxidizable metal, or other element used to create a conductive filament, included within modified memory layer 104. Inhibitors according to particular embodiments will be described in more detail below.

In the embodiment of FIGS. 1A and 1B, second portion 104-1 can extend only part way into modified memory layer 104 from a surface opposite to first electrode 102. Accordingly, in the embodiment shown, second portion 104-1 can be proximate to a first electrode 102.

As noted above, it is understood that a modified layer 104 can include layers or sections in addition to those shown as 104-0/1.

FIG. 1A shows memory element 100 in one state, in which a conductive structure has not been created within modified memory layer 104.

Figure 15A:
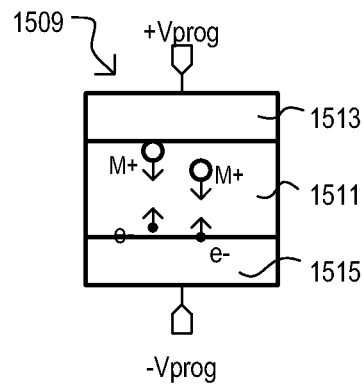
FIGS. 15A to 15C show data programming operations for a conventional memory element.
Figure 15B:
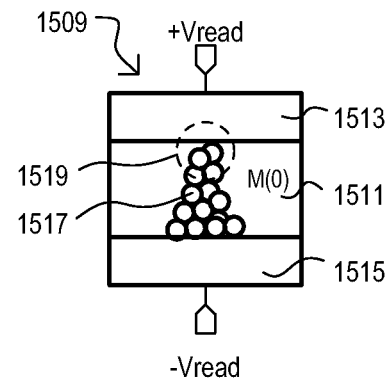
Figure 15C:
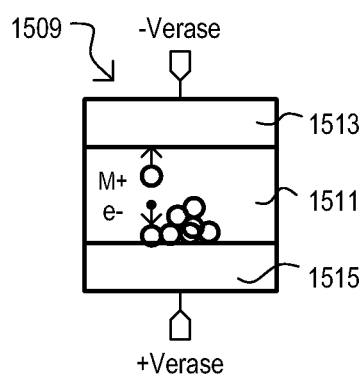

FIG. 1B shows a memory element 100 in another state, in which a high conductivity structure 108 (e.g., filament) has been created by application of an electric field. Structure 108 can include a vulnerable portion 110 that can include smaller atom clusters that might conventionally be more susceptible to degrading (e.g., being oxidized and then migrating away from the conductive structure 108). However, unlike a conventional approach, such as that shown in FIG. 15B, such a vulnerable portion 110 can be formed within second portion 104-1, which includes one or more inhibitors (e.g., 112). Such inhibitors can stabilize vulnerable portion 110 by reducing or substantially eliminating unwanted oxidation at vulnerable portion 110.

As will be described in more detail below, inhibitors (e.g., 112) can be selected based on the element(s) that form a conductive filament (e.g., 108), the materials making up the memory layer 104, the process used to fabricate the memory element 100, the process used to fabricate an integrated circuit that includes the memory element 100, or combinations thereof.

FIGS. 2A to 2D show a method of making a memory element like that of FIGS. 1A and 1B according to one embodiment.

FIG. 2A shows the formation of a second electrode 106. A second electrode 106 can provide a conductive connection between one electrode of memory element 100 and other portions of an integrated circuit device. A second electrode 106 can be formed from a material suitable for a given overall manufacturing process, and can include, as but a few of many possible examples, copper, aluminum, tungsten, titanium nitride, a silicide, or combinations thereof. In particular embodiments, an indifferent electrode 106 does not substantially include a metal that is oxidizable within modified memory layer 104.

FIG. 2B shows the formation of an initial memory layer 104'. An initial memory layer 104' can be provide a matrix in which filaments can be formed and dissolved. In some embodiments, a memory layer 104' can be a solid-state ion conducting material, and in particular embodiments, and can include a chalcogenide compound or a metal oxide. A solid electrolyte layer can be formed by deposition, including but not limited to chemical vapor deposition (CVD) technology, atomic layer deposition (ALD) technology, physical vapor deposition (PVD) technology, or any other suitable technology. An initial memory layer 104' can also be formed with wet chemical methods. For example, an initial memory layer 104' can be electroplated onto a second electrode 106. Further, such steps can include dry or wet oxidation, as well as photo- or thermal incorporation steps that enable a conductive element to be distributed throughout an initial memory layer 104'.

In some embodiments, an initial memory layer 104' can be substantially homogeneous. However, in other embodiments an initial solid electrolyte layer 104' can include various other layers, or gradients of constituent elements.

FIG. 2C shows the formation of a second portion 104-1. One or more inhibitors (e.g., 112) can be incorporated into initial memory layer 104' through a top surface of such a layer. In the particular embodiment shown, a compound source 114 can be formed on a top surface of initial memory layer 104'. According to the inhibitor(s) employed, energy and/or conditions can be applied that enable such compounds to be incorporated into the memory layer (e.g., by absorption, diffusion, etc.) to a desired depth. It is understood that a compound source 114 can be formed as a monolayer, or can be a sub-monolayer. A compound source 114 can take a gaseous, liquid or solid form. In some embodiments, a wet chemical method can be used to introduce inhibitors into initial memory layer 104'. A memory element 100 can be submerged into a chemical bath containing one or more inhibitors. The inhibitors can form on a surface of initial memory layer 104' (e.g., adsorb) or enter locations internal to the initial memory layer 104' (e.g., absorb). Further, in some embodiments, a compound can be implanted into memory layer 104' (e.g., via ion implantation).

FIG. 2D shows a memory element 100 after a second portion 104-1 is complete. A second portion 104-1 can be a contiguous layer. However, in alternate embodiments, a second portion 104-1 can be non-contiguous. Further, in some embodiments, a second portion 104-1 can have a concentration gradient with respect to its inhibitor(s). In some embodiments, such a gradient can increase in a direction (d) from a surface of solid electrolyte layer 104. Alternatively, such a gradient can decrease in direction (d) from the surface of solid electrolyte layer 104.

A first electrode can be subsequently formed over a top surface of the structure shown to arrive at a structure like that of FIGS. 1A and 1B.

FIGS. 3A to 3D show a method of making a memory element like that of FIGS. 1A and 1B according to another embodiment.

FIG. 3A shows the formation of a second electrode 106. Such actions can be same as those of FIG. 2A, or equivalents.

Figure 3B:
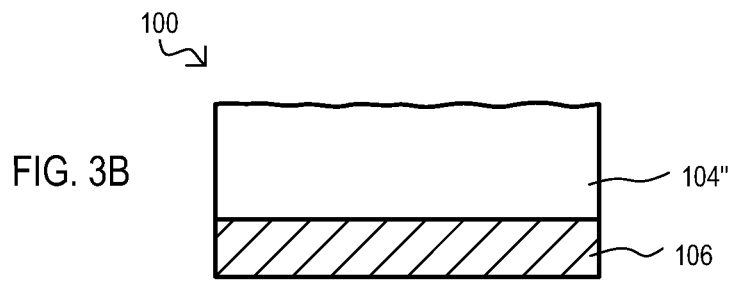

FIG. 3B shows the formation of a partial memory layer 104". A partial memory layer 104" can be formed in a manner like that described in conjunction with FIG. 2B, or an equivalent. However, a thickness can be less than a total thickness of a desired modified memory layer (i.e., 104).

Figure 3C:
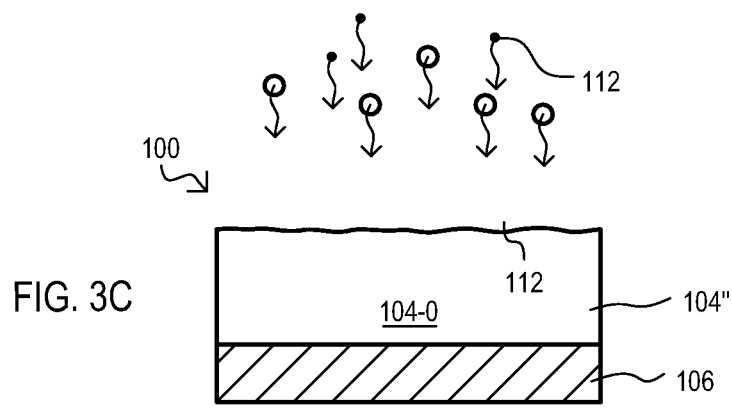

FIG. 3C shows the formation of a second portion 104-1. Unlike the embodiment of FIG. 2C, a second portion 104-1 can be deposited or otherwise formed on a top surface of partial memory layer 104", rather than incorporated through a top surface. That is, inhibitors can be formed in combination with the memory layer materials, in an in situ fashion. Such a formation step can include any of CVD technology, ALD technology, PVD technology, or in a particular embodiment, by wet chemical methods, or any other suitable deposition technology, as well as those other steps noted for FIG. 2B.

Figure 3D:
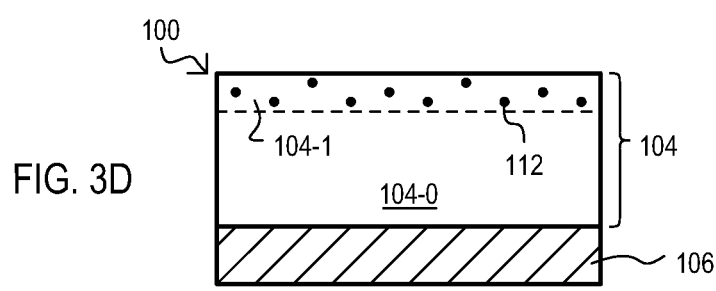

FIG. 3D shows a memory element 100 after a second portion 104-1 is complete. A first electrode can be subsequently formed over a top surface of the structure shown. As in the case of FIG. 2D, second portion 104-1 can have contiguous or non-contiguous sections of inhibitors. Further, a second portion 104-1 can include a concentration gradient with respect to such inhibitors.

FIGS. 4A to 4D show a memory element 400 and formation steps in side cross sectional views, according to another embodiment. FIGS. 4A to 4D show a memory element in which substantially all of a modified memory layer includes inhibitors incorporated therein.

Figure 4A:
FIGS. 4A to 4D are a sequence of side cross sectional views showing a method of forming a memory element according to another embodiment.

FIG. 4A shows the formation of a second electrode 106. Such actions can be same as those of FIG. 2A, or equivalents.

Figure 4B:
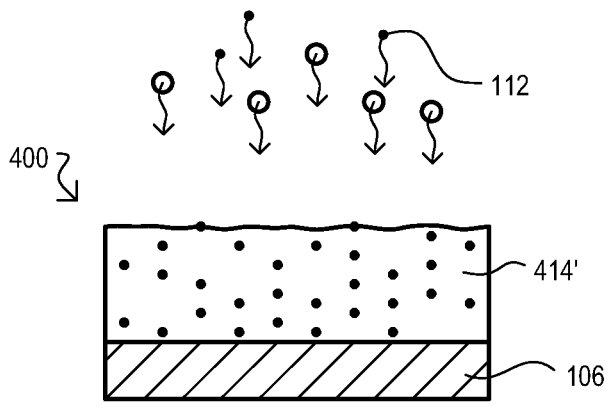

FIG. 4B shows the formation of a partial memory layer 414'. A partial memory layer 414' can be formed in a manner like that described in conjunction with FIG. 3C, or an equivalent. However, unlike FIG. 3C, inhibitors (e.g., 112) can be included with memory layer materials throughout the formation of the modified memory layer.

Figure 4C:
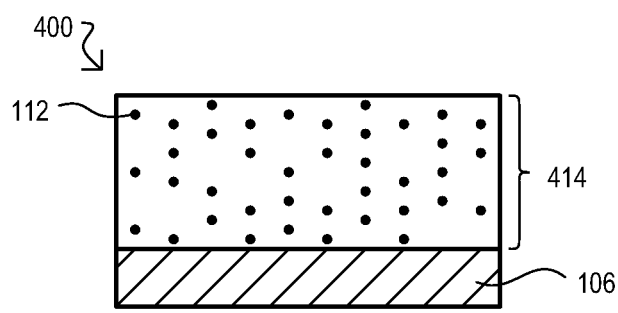

FIG. 4C shows the completion of modified memory layer 414. Unlike the embodiment of FIGS. 1A/B, inhibitors (e.g., 112) can extend throughout modified memory layer 414, and not be limited to a portion of such a layer.

The actions shown in FIGS. 4B and 4C can include any of the processing described above in FIGS. 2A to 3D, including deposition, wet chemical and/or implantation techniques.

Figure 4D:
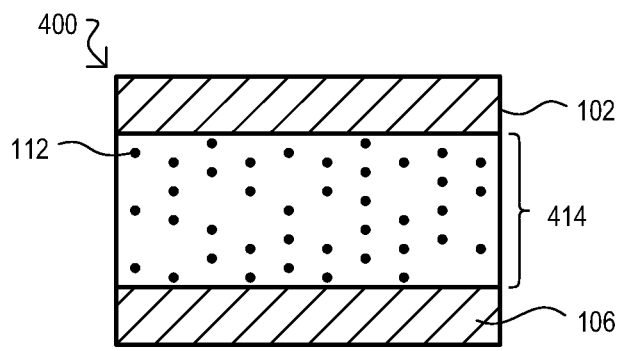

FIG. 4D shows the formation of a first electrode 102 on a top surface of modified memory layer 414.

As in the case of FIG. 2D, modified memory layer 414 can have contiguous or non-contiguous sections of inhibitors. Further, modified memory layer 414 can include a concentration gradient with respect to such inhibitors.

Figure 5:
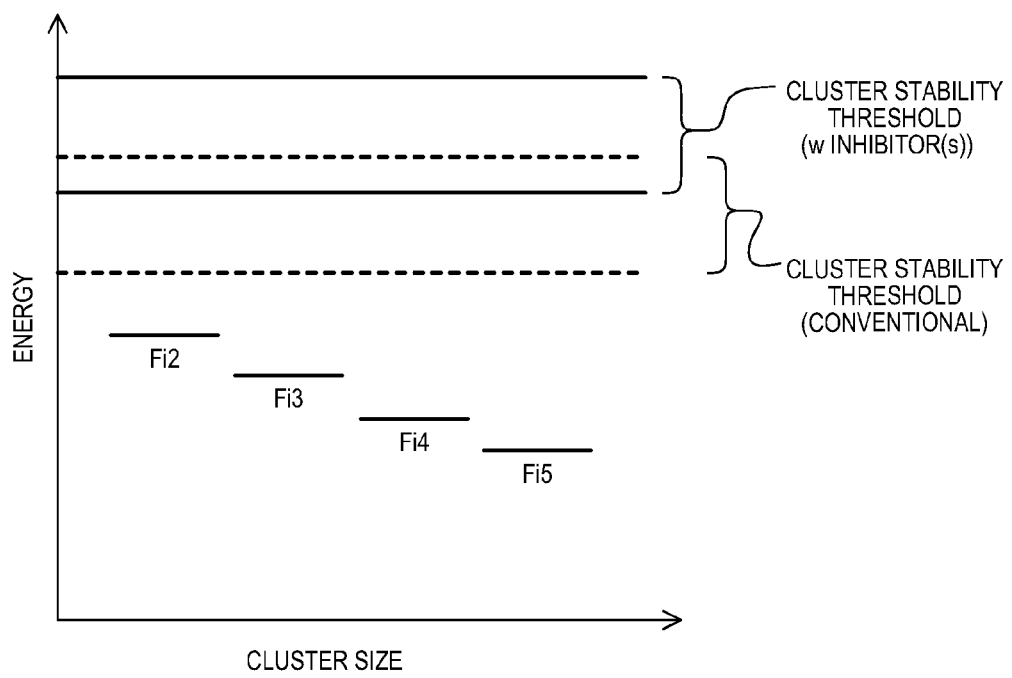
FIG. 5 is a diagram showing stability levels for different size clusters of metal atoms in a memory material.

FIG. 5 is a graph comparing responses of filament atomic clusters within a memory layer without inhibitors (CONVENTIONAL) and the same memory layer material modified with inhibitor(s) (w INHIBTOR(s)), according to an embodiment.

FIG. 5 shows energy threshold levels (ENERGY) that can result in a cluster of filament atoms oxidizing and moving away to another location within the memory layer. In FIG. 5, atom clusters of a filament are shown by an arbitrary symbol "Fi". It is understood that "Fi" can correspond to an atomic symbol (e.g., Ag, Cu) of an element that forms a filament. It is also understood that F can be a non-metal, or can include different elements, in the event a filaments is formed with more than one element.

FIG. 5 shows how clusters of smaller size can require less energy to reach an ionically conductive state. For example, a cluster of two atoms (Fi2) requires less energy to move to a cluster stability threshold.

FIG. 5 also shows how inclusion of inhibitors within a memory layer, according to an embodiment, can raise the amount of energy required to place a cluster into a conductive state.

It is understood that FIG. 5 is but one representation of inhibitor effects. Different materials can have different responses.

Figure 6B:
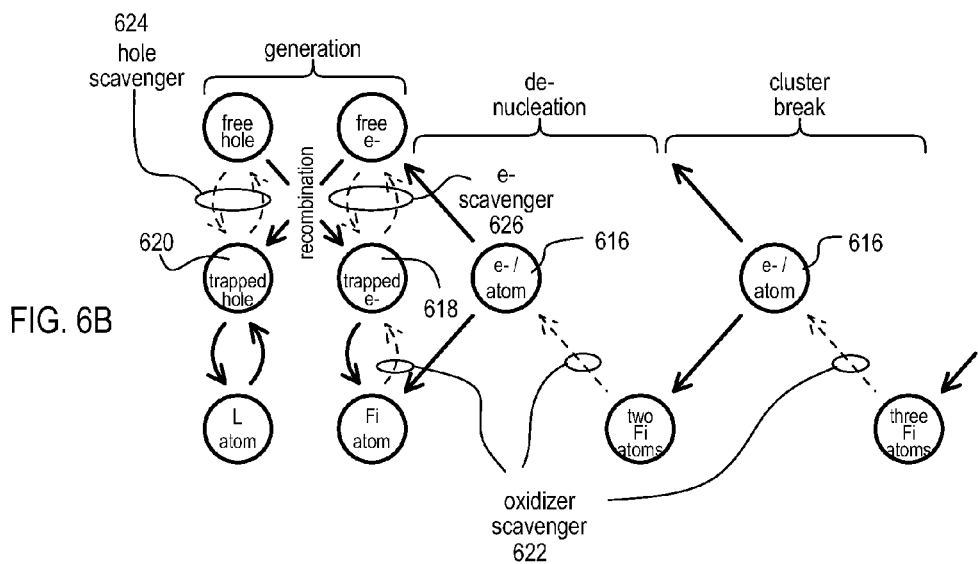
Figure 6C:
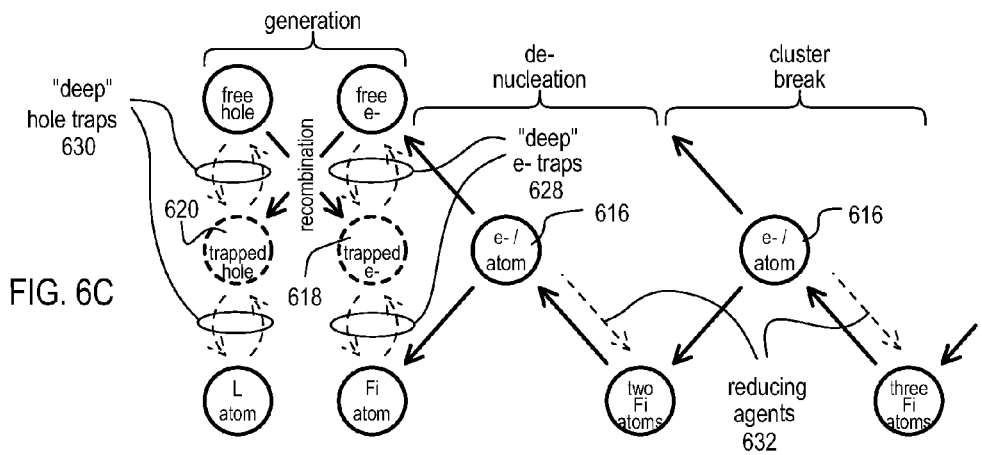

FIGS. 6A to 6C are diagrams that illustrate memory cell operations according to embodiments.

FIG. 6A is a diagram representing how filament atom clusters can degrade in a conventional memory layer (i.e., one without inhibitors). A "cluster break" section shows how a cluster of atoms (in this example, shown by the generic symbol "Fi") can oxidize, freeing a cluster ion and/or electron 616. Such actions can reduce cluster sizes. A "de-nucleation section" shows how a remaining cluster atom can migrate away from a filament location. A "generation" section shows mechanisms that can occur within a memory layer that can enable oxidation of cluster atoms. As shown, cluster atoms can lose electrons that migrate to electron traps 618. Electrons can escape traps as free electrons. Similarly, the presence of memory layer defects and/or elements can present "hole" traps 620. Holes and electrons continuously recombine with one another (as shown by "recombination"). In FIG. 5, a memory layer element is shown by an arbitrary symbol "L". It is understood that "L" can correspond to an atomic symbol (e.g., S, O) of an element within a memory layer. It is also understood that L can include different elements, in the event a memory is formed with more than one element.

FIGS. 6B and 6C are diagrams representing how, according to embodiments, some inhibitors within a modified memory layer can prevent and/or decrease degradation of filament clusters within the modified memory layer, as compared to a conventional memory layer material (i.e., that shown in FIG. 6A). FIGS. 6B and 6C show multiple examples of inhibiting compound mechanisms according to embodiments. It is understood that embodiments can include one or more of the described mechanisms.

Referring to FIG. 6B, mechanisms can include inhibitors that serve as "scavengers" that can bind with, increase the activation energy of, or otherwise occupy constituents of the cluster degradation process described. As but a few examples, inhibitors can include oxidizer scavengers (effect represented by 622) that scavenge oxidizers to reduce the rate at which a cluster element within a modified memory layer is oxidized. Oxidizer scavengers can also include precursor scavengers that act on molecules or other compounds that are likely to form an oxidizing agent.

Inhibitors can also include scavengers to reduce electron mobility, including hole scavengers (effect represented by 624) and/or electron scavengers (effect represented by 626). Such scavengers can reduce the number and/or mobility of electrons within a modified memory layer, thereby decreasing the amount and/or rate at which cluster atoms can be oxidized.

Referring to FIG. 6C, inhibitors can also be included that create "deep" hole traps (effect represented by 630) and/or deep electron traps (effect represented by 628). Such traps can increase the energy required for electron mobility, thereby decreasing a rate at which cluster atoms can be oxidized. In addition or alternatively, inhibitors can be reducing agents (effect represented by 632). Reducing agents can serve to reduce cluster ions back to non-ionic states, thus limiting the oxidation rate and/or mobility of a cluster element within a modified memory layer.

Particular examples of inhibitors will be described in more detail below.

FIGS. 7A and 7B show an inhibitor operation that can be included in embodiments. FIGS. 7A and 7B show an inhibitor that operates on an oxidizer precursor (i.e., a precursor scavenger).

FIG. 7A shows how an oxidizer precursor can contribute to a degradation of a filament cluster. An oxidizer precursor 732 can be subject to activation energy or an event that results in the precursor 732 forming an oxidizing agent 734. Oxidizing agent 734 can oxidize a cluster atom within a cluster 736, which can result in cluster atoms moving away from a cluster location. This can reduce a conductivity of a formed filament.

FIG. 7B shows inclusion of a precursor scavenger 738. A precursor scavenger 738 can bind with precursor 732, or otherwise prevent precursor 732 from forming an oxidizing agent. Consequently, a cluster 736 can be less likely to breakdown (i.e., oxidize and move away).

In some embodiments, a precursor scavenger can be a water or oxygen scavenger that can eliminate, or substantially reduce these common processing materials (i.e., water, oxygen) from becoming oxidizers in a modified memory layer.

In one very particular embodiment, a modified memory layer can include sulfur, and corresponding inhibitors can include scavengers of free $S^{-2}$, $HS^-$ and/or $H_2S$. In a particular embodiment, such scavengers can be used for a modified memory layer including a solid electrolyte layer of $GeS_2$, and a filament element can be silver (i.e., Fi=Ag).

FIGS. 8A and 8B show another inhibitor operation that can be included in embodiments. FIGS. 8A and 8B show an inhibitor that operates on oxidizing agents.

FIG. 8A shows how an oxidizing agent 834 can oxidize an atom within a cluster 836, as shown in FIG. 7A, to thereby reduce a conductivity of a formed filament.

FIG. 8B shows inclusion of an oxidizer scavenger 838. Oxidizer scavenger 838 can bind with oxidizing agent 834, or otherwise prevent oxidizing agent 834 from oxidizing atoms in a cluster 836. Consequently, a cluster 836 can be less likely to breakdown, as compared to a system without oxidizer scavenger 838.

Figure 9B:
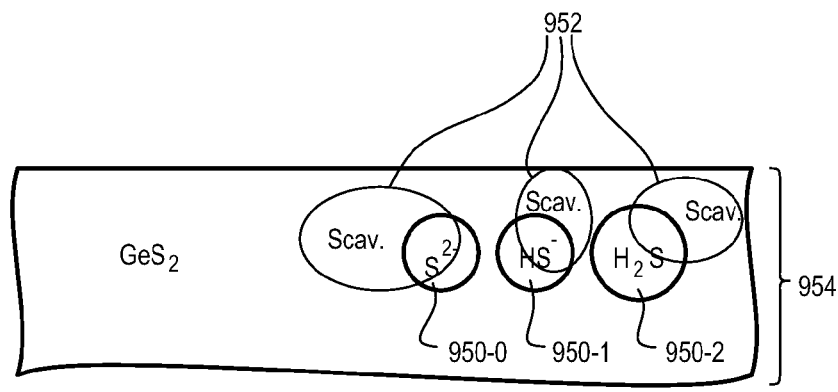

FIGS. 9A and 9B show inhibitor operations that can be included in one very particular embodiment. FIGS. 9A and 9B show inhibitors directed to a particular memory layer that includes germanium and sulfur, in particular, a solid electrolyte layer that includes germanium disulfide ($GeS_2$).

FIG. 9A shows a conventional approach in which a memory layer 940 of $GeS_2$ can be formed with a fabrication process 942 that combines germanium from a germanium source 944 with sulfur from a sulfur source 946. A fabrication process 942 can result in oxidizing agents or oxidizer precursors. In the particular embodiment shown, memory layer 940 can be formed with free sulfur $S^{2-}$ (950-0), or bisulfide ions HS— (950-1), or hydrogen sulfide $H_2S$ (950-2), as but three examples. Such constituents can oxidize or serve as oxidizer precursors, as noted above. As a result, when filament clusters are subsequently formed within memory layer 940, by application of an electric field, such clusters can be more subject to degradation by being oxidized (or having lower oxidation energy levels).

It is noted that the incorporation of oxidizers (and/or oxidizer precursors) can occur during a fabrication process that forms a memory layer (e.g., 940). In addition, oxidizers (and/or oxidizer precursors) can form in steps subsequent to the formation of the memory layer. For example, oxidizers can be generated in metal etch step (such as one utilizing a $BCl_3/Cl_2$ gas plasma) or in a photoresist strip process at high temperature with $H_2O$ and/or $O_2$ gas plasmas.

FIG. 9B shows a modified memory layer 954 having inhibitors 952 incorporated therein. Inhibitors 952 can act as scavengers for oxidizer/oxidizer precursors (950-0, -1, -2). Inhibitors can bind with or otherwise prevent oxidizers from oxidizing cluster atoms within modified memory layer, can increase the energy required for an oxidizer to oxidize cluster atoms, and/or can prevent, or decrease the rate at which an oxidizer precursor forms an oxidizing agent. The presence of inhibitors can perform such actions as a memory layer is being formed, during process steps after such a modified memory layer is formed and/or during the lifetime of a device incorporating such inhibitors.

As noted above, inhibitors can be selected according to device composition and/or manufacturing process. In alternate embodiments that can form filaments of copper, inhibitors can be employed that serve as scavengers of oxygen compounds and/or scavengers of precursors of such compounds. In a particular embodiment, filaments can include copper and an inhibitor can be a scavenger of oxide forming compounds, such as hydroxide (OH—), as but one example.

Scavengers of oxidizers, and oxidizer precursors, can include, but are not limited to nitrites, sulfites, hydroquinones, and carbazides.

In addition to scavenging the items noted above (i.e., $S^{2-}$, HS—$H_2S$), inhibitors can also be directed to other oxidizing impurities, including but not limited to: halides, nitrides, nitrates and/or sulfur oxides. Inhibitors for such purposes can include, for example, nitrides, sulfites, hydroquinones, or carbazides, as but a few examples.

Other suitable inhibitors of this type can be selected according to expected oxidizers and/or oxidizer precursors in a memory layer material utilized in a memory element.

FIGS. 10A to 10D are representations of a particular inhibitor operation that can be included in embodiments. FIGS. 10A to 10D are diagrams representing an inhibitor operating as a hole scavenger.

FIGS. 10A and 10B show a conventional arrangement in which a memory layer can include a hole (represented by 1056). As shown in FIG. 10A, a hole 1056 can exist within a memory layer due to defects, impurities or other well-known sources.

As shown in FIG. 10B, a hole 1056 can provide an opportunity to re-combine with an electron from an atom (again represented by the place holder symbol Fi) within a cluster 1036, enabling the oxidation of an atom within the cluster 1036. A resulting ion 1058 can then migrate away from a filament or the like, degrading the filament.

Figure 10C:
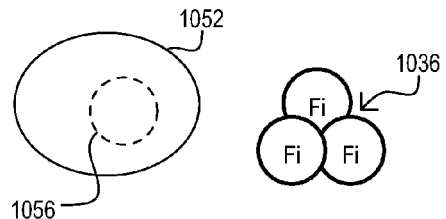
Figure 10D:
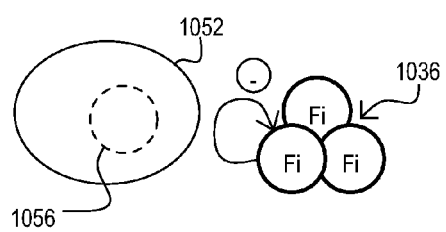

FIGS. 10C and 10D show a modified memory layer according to an embodiment. A modified memory layer can include an inhibitor material that operates as a hole scavenger (one shown as 1052). A hole scavenger 1052 can eliminate a hole or make it more difficult for a hole to re-combine with an electron. Thus, in the presence of hole scavengers 1052, oxidation of a cluster 1036 can be prevented or reduced.

FIGS. 11A to 11D show a further inhibitor operation that can be included in embodiments. FIGS. 11A to 11D are diagrams representing an inhibitor operating as an electron scavenger.

FIGS. 11A and 11B show a conventional arrangement in which a memory layer can include free electrons (one represented by 1162). As shown in FIG. 11A, an atom from a cluster 1136 can be oxidized, creating an ion 1158 and an electron. As shown in FIG. 11B, the presence of a free electron 1162 can cause a mobile ion 1162 to reduce to a non-ionic state away from the (now smaller) cluster 1136'. This can degrade a conductive filament.

Figure 11C:
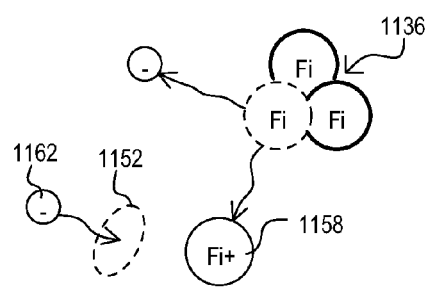
Figure 11D:
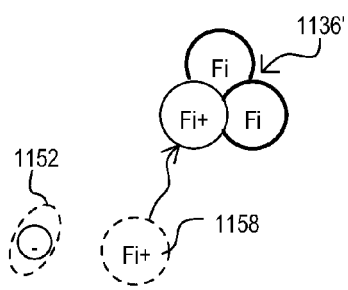

FIGS. 11C and 11D show a modified memory layer according to a further embodiment. A modified memory layer can include an inhibitor material that operates as an electron scavenger (one shown as 1152). An electron scavenger 1152 can eliminate an electron, or make it more difficult for an electron to recombine with a cluster ion. Thus, in the presence of electron scavengers 1152, oxidation of a cluster 1136 can be prevented or reduced, as a cluster ion 1158 can return to a cluster.

Figure 12B:
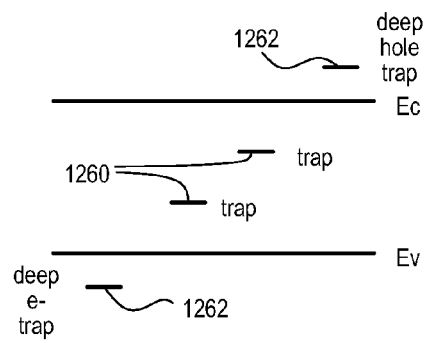

FIGS. 12A and 12B are graphs showing inhibitor operations according to further embodiments.

FIG. 12A is an energy band diagram of a conventional memory material. FIG. 12A shows a valence band limit Ev and a conduction band limit Ec. As shown, a memory material can include "lower energy" traps 1260 that can enable holes and/or electrons to have energy states closer to that required for conduction.

FIG. 12B shows modified memory material according to an embodiment. A modified memory material can have "deep" hole and/or electron traps 1262. Such deep traps can increase the energy needed for holes and/or electrons to reach a conductive state. Thus, that ability or rate at which filament clusters can degrade can be reduced.

Hole and/or electron scavengers, or deep traps can include, as but a few examples, dyes such as cyanines, or heterocyclic compounds such as phenyl mercato tetrazole. In other embodiments, metals can be used, including but not limited to: copper, gold, platinum, palladium, iridium, rhodium, or osmium.

Figure 13B:
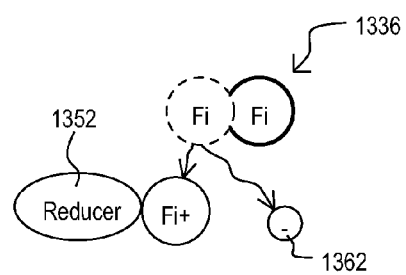
Figure 13C:
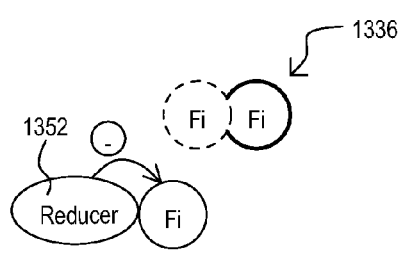
Figures 14A, 14B:
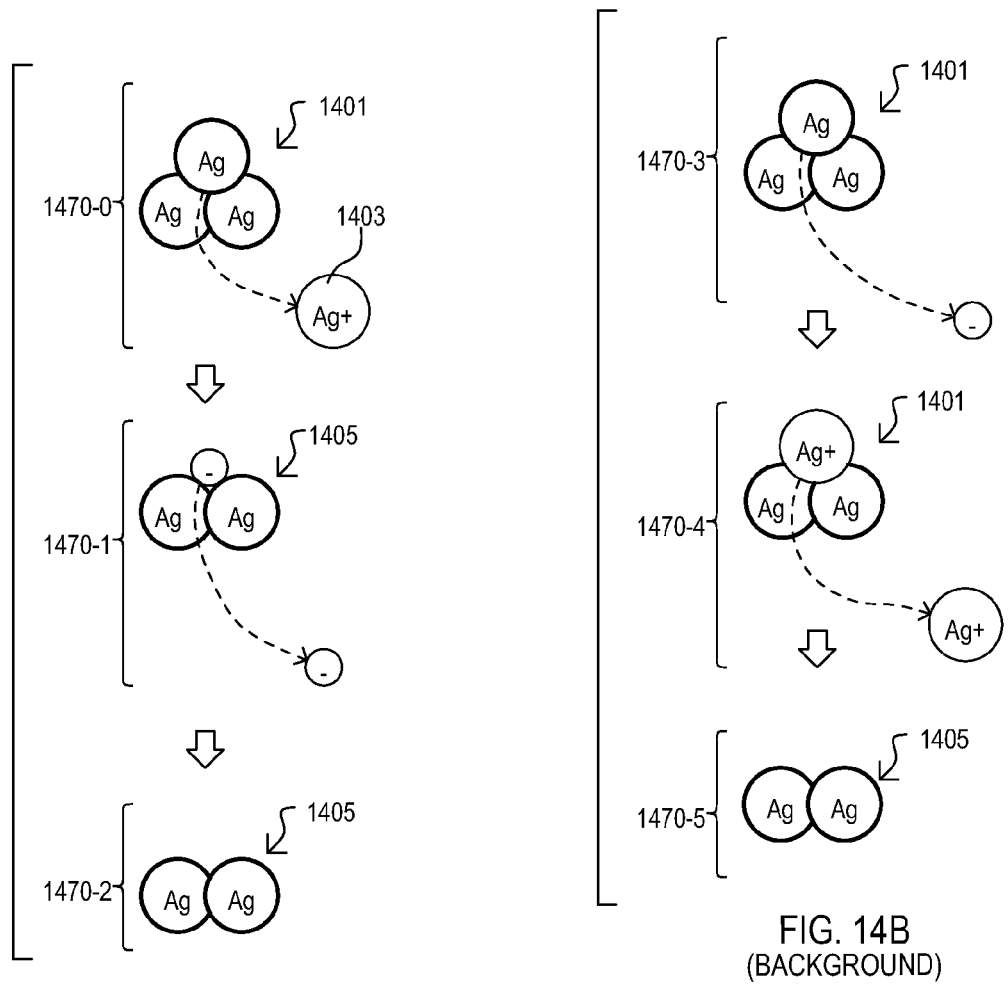
FIGS. 14A to 14D are a sequence of diagrams showing potential degradations mechanisms for conductive filament clusters in a conventional solid electrolyte based memory, such as a conductive bridging random access memory (CBRAM) type element.
Figures 14C, 14D:
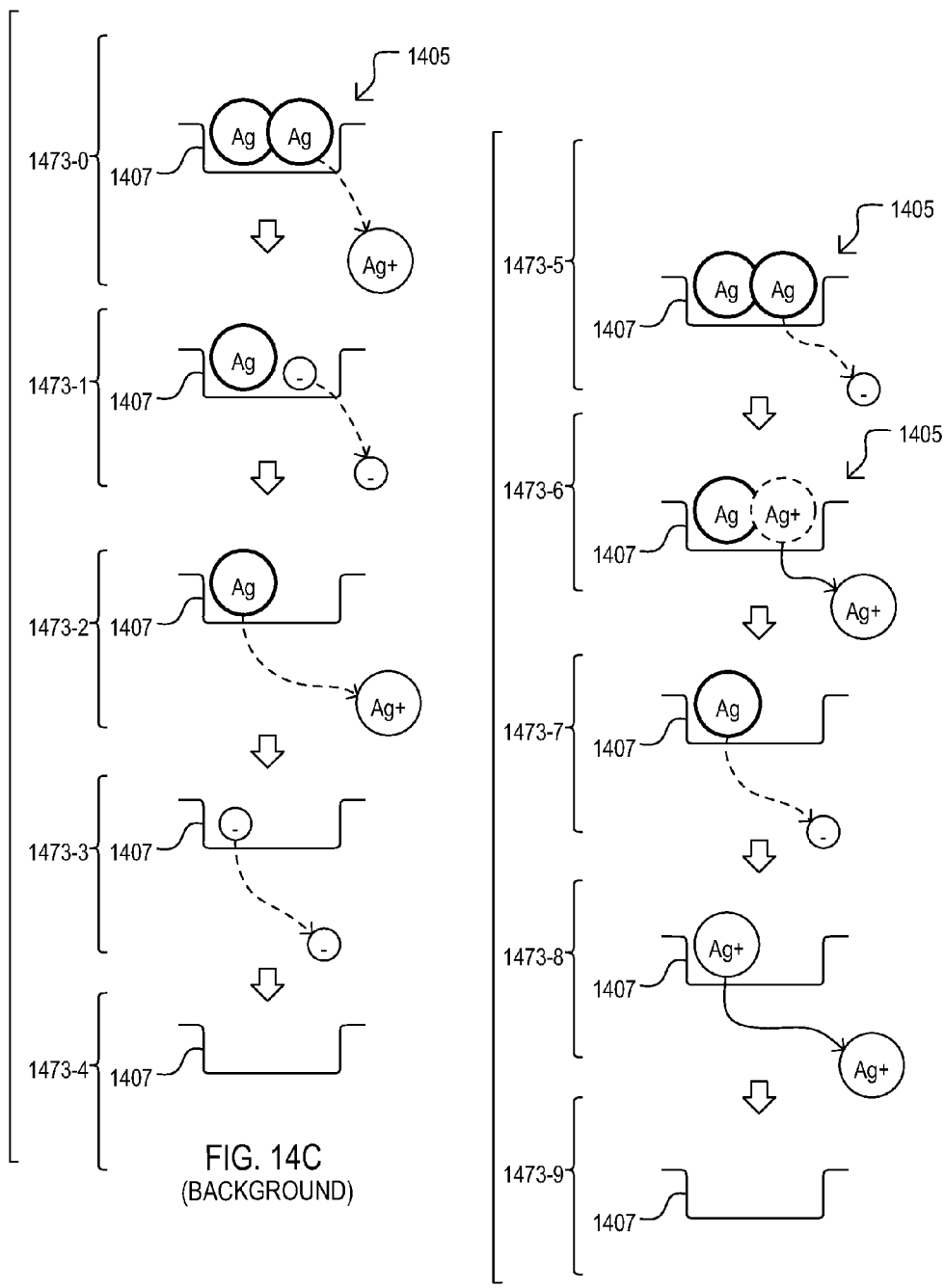

FIGS. 13A to 13C show another inhibitor operation that can be included in embodiments. FIGS. 13A to 13C are diagrams representing an inhibitor operating as a reducing agent.

FIG. 13A shows a conventional oxidizing action noted above, in which an ion 1358 and free electron 1362 can be created by the oxidization of an atom of a cluster 1336.

FIGS. 13B and 13C show a modified memory layer according to an embodiment. A modified memory layer can include a reducing agent (shown as 1352) as an inhibitor material. FIG. 13B shows an ion being formed from a cluster 1336. FIG. 13C shows the presence of a reducing agent 1352 in proximity to a cluster 1336. Reducing agent 1352 can reduce the ion 1358, limiting its migration from the cluster.

Reducing agents can include tin chloride ($SnCl_2$) or thio-ureas, as but two examples.

Inhibitor materials and/or layers as described herein can be included in memory elements having one or more memory layers in which clusters of elements can be formed to alter a conductivity of the memory layer. As noted above, such materials/layers can be included while memory elements are being fabricated to address degradation mechanisms that can occur during and after fabrication steps of an integrated circuit device that includes such memory elements.

Including of inhibitor material and/or layers can improve memory cell retention and/or endurance by stabilizing all, or particular portions of, a conductive structure (e.g., filament) formed in a memory material, as modified according to the general teachings set forth herein.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention can be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
    forming at least one memory layer over a first electrode, the memory layer having at least one element formed therein that oxidizes in the presence of an electric field to form conductive paths within the memory layer; and
    forming an inhibiting layer within the memory layer that increases an oxidation energy for the at least one element, as compared to the oxidation energy for the at least one element in the memory layer without the inhibiting layer.

2. The method of claim 1, wherein:
    the inhibiting layer is formed after the memory layer is formed.

3. The method of claim 1, wherein:
    the inhibiting layer is incorporated into the memory layer through a surface of the memory layer.

4. The method of claim 1, further including:
forming a second electrode over the top surface of the memory layer.

5. The method of claim 1, wherein:
forming the inhibiting layer includes forming a material is selected from the group of:
- a hole scavenger that occupies a hole or increases a formation energy of a hole within the memory layer;
- an electron scavenger that binds with free electrons within the memory layer;
- a reducing agent that provides electrons for reducing ionic forms of the at least one element;
- a scavenger of predetermined oxidizer precursors that binds with such oxidizer precursors, an oxidizer precursor being a compound that forms an oxidizing agent of the at least one element;
- a scavenger of oxidizers that prevent such oxidizers from oxidizing the at least one element;
- a scavenger of any of: halides, nitrides, nitrates, or sulfur oxides; and
- a scavenger of a compound, or precursor of a compound, that forms an oxide of the at least one element.

6. The method of claim 1, wherein:
forming the memory layer includes forming a layer of $GeS_2$; and
forming the inhibitor material includes forming a scavenger of any selected from the group of: sulfur with an oxidation state of −2 ($S^{2-}$), HS—, or $H_2S$.

7. The method of claim 1, wherein:
the memory layer comprises a metal oxide.

8. A method, comprising:
incorporating at least one inhibitor compound into a memory layer of a memory element in which conductive regions are formed and dissolved, the inhibitor compound increasing energy needed to oxidize clusters of at least one element formable within the solid electrolyte by application of an electric field to create the conductive regions.

9. The method of claim 8, wherein:
the at least one inhibitor compound decreases ionic mobility of at least one oxidized element within the memory layer.

10. The method of claim 8, wherein:
the at least one inhibitor compounds decreases mobility of electrons within the memory layer.

11. The method of claim 8, further including:
forming the memory layer between an active electrode layer and an indifferent electrode layer, the active electrode layer comprising the at least one element; and
incorporating the at least one inhibitor compound into a portion of the memory layer proximate to the active electrode; wherein
a portion of the memory layer proximate the indifferent electrode does not substantially include the inhibitor.

12. The method of claim 8, wherein:
the inhibitor compound is selected from the group of:
- a hole scavenger that occupies a hole or increases a formation energy of a hole within the memory layer;
- an electron scavenger that binds with free electrons within the memory layer;
- a reducing agent that provides electrons for reducing ionic forms of the at least one element;
- a scavenger of predetermined oxidizer precursors that binds with such oxidizer precursors, an oxidizer precursor being a compound that forms an oxidizing agent of the at least one element;
- a scavenger of oxidizers that prevent such oxidizers from oxidizing the at least one element;
- a scavenger of any of: halides, nitrides, nitrates, or sulfur oxides; and
- a scavenger of a compound, or precursor of a compound, that forms an oxide of the at least one element.

13. The method of claim 8, wherein:
forming the memory layer comprises forming a metal oxide.

14. A method, comprising:
forming a memory material formed between two electrodes, where the forming of the memory material comprises
including in the memory material at least one element that is oxidizable in the presence of an electric field applied across the electrodes, and
including an inhibitor material incorporated into at least a portion of the memory material that decreases an oxidation rate of the at least one element within the memory material with respect to the memory material alone.

15. The method of claim 14, wherein:
forming the memory material includes
forming the memory material in contact with a first of the electrodes at a first surface and in contact with a second of the electrodes at a second surface, and
including the inhibitor material to extend into only a portion of the memory material from the first surface.

16. The method of claim 14, wherein:
the inhibitor material is selected from the group of:
- a hole scavenger that occupies a hole or increases a formation energy of a hole within the memory material;
- an electron scavenger that binds with free electrons within the memory material;
- a reducing agent that provides electrons for reducing ionic forms of the at least one element;
- a scavenger of predetermined oxidizer precursors that binds with such oxidizer precursors, an oxidizer precursor being a compound that forms an oxidizing agent of the at least one element;
- a scavenger of oxidizers that prevent such oxidizers from oxidizing the at least one element; and
- a scavenger of any compound selected from the group of: halides, nitrides, nitrates, or sulfur oxides.

17. The method of claim 14, wherein:
the inhibitor material is a scavenger of a compound, or precursor of a compound, that forms an oxide of the at least one element.

18. The memory element of claim 14, wherein
the inhibitor material is selected from the group of: tin chloride ($SnCl_2$), thirourea ($SC(NH_2)_2$), cyanine, a heterocyclic compound including a suitable mercapto tetrazole, a nitrite comprising $NO_2^-$ with a selected cation, a nitrite, a sulfite, a hydroquinone, a carbohydrazide, a nitrite, a sulfite, a hydroquinone, and a carbohydrazide.

19. The memory element of claim 14, wherein:
the at least one element is selected from: silver and copper.

20. The method of claim 14, wherein:
forming the memory material includes forming a metal oxide.

* * * * *